(12) United States Patent
Baker et al.

(10) Patent No.: US 9,230,878 B2
(45) Date of Patent: Jan. 5, 2016

(54) INTEGRATED CIRCUIT PACKAGE FOR HEAT DISSIPATION

(71) Applicant: Lenovo Enterprise Solutions (Singapore) Pte. Ltd., Singapore (SG)

(72) Inventors: Anthony E. Baker, Stittsville (CA); Stephen J. Flint, Ottawa (CA); Jian Meng, Kanata (CA)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 329 days.

(21) Appl. No.: 13/861,411

(22) Filed: Apr. 12, 2013

(65) Prior Publication Data

US 2014/0307390 A1  Oct. 16, 2014

(51) Int. Cl.
*H05K 7/20* (2006.01)
*H01L 23/367* (2006.01)
*H01L 23/373* (2006.01)
(Continued)

(52) U.S. Cl.
CPC ........ *H01L 23/3675* (2013.01); *H01L 23/3735* (2013.01); *H01L 23/42* (2013.01); *H01L 23/3736* (2013.01); *H01L 23/3737* (2013.01); *H01L 23/4093* (2013.01); *H01L 2224/73253* (2013.01); *H01L 2224/83385* (2013.01)

(58) Field of Classification Search
CPC . G06F 1/181–1/182; H05K 7/20218–7/20381; H05K 7/20409–7/20418; H05K 7/20009–7/20202; H01L 23/367–23/3677; H01L 23/473; H01L 23/46–23/467
USPC .......... 361/676–678, 679.46–679.54, 361/688–723; 165/80.1–80.5, 104.33, 185; 312/236; 174/15.1–15.3, 16.1–16.3, 174/547, 548; 257/712–722, E23.088; 454/184
See application file for complete search history.

(56) References Cited

U.S. PATENT DOCUMENTS 5,276,586 A   1/1994  Hatsuda et al.
5,773,362 A   6/1998  Tonti et al.
(Continued)

FOREIGN PATENT DOCUMENTS

EP    1378940 A2    1/2004
JP    61067248 A    4/1986
(Continued)

OTHER PUBLICATIONS

Wikipedia, "Heat sink", Published on: Jun. 9, 2012, Wikipedia, the free encyclopedia [online], [retrieved on Jan. 17, 2013]. Retrieved from the Internet <URL: http://en.wikipedia.org/w/index.php?title=Heat_sink&oldid=496783586>.
(Continued)

*Primary Examiner* — Anthony Haughton
*Assistant Examiner* — Razmeen Gafur
(74) *Attorney, Agent, or Firm* — Zilka-Kotab, PC

(57) ABSTRACT

An apparatus for enclosing an electronic component to a base comprising, an enclosure attached to a base and surrounding an electronic component. The enclosure divided into a first portion and a second portion along a first plane substantially parallel to the base. The second portion of the enclosure is attached to the base. The first portion of the enclosure is attached to the second portion of the enclosure. The enclosure including one or more extruding elements on an exterior surface of the enclosure. The one or more extruding elements on the exterior surface of the enclosure increases an exterior surface area of the enclosure facilitating dissipation of heat from the electronic component.

19 Claims, 4 Drawing Sheets

(51) Int. Cl.
*H01L 23/42* (2006.01)
*H01L 23/473* (2006.01)
*H01L 23/40* (2006.01)

(56) References Cited

U.S. PATENT DOCUMENTS

| | | | |
|---|---|---|---|
| 5,825,087 A | 10/1998 | Iruvanti et al. | |
| 6,082,443 A * | 7/2000 | Yamamoto et al. | 165/104.26 |
| 6,111,314 A | 8/2000 | Edwards et al. | |
| 6,144,556 A * | 11/2000 | Lanclos | 361/695 |
| 6,232,680 B1 * | 5/2001 | Bae et al. | 310/17 |
| 6,656,770 B2 | 12/2003 | Atwood et al. | |
| 6,921,683 B2 | 7/2005 | Nakayama | |
| 7,078,265 B2 | 7/2006 | Terui et al. | |
| 7,327,027 B2 | 2/2008 | Houle et al. | |
| 7,449,361 B2 | 11/2008 | Baskaran et al. | |
| 7,593,228 B2 | 9/2009 | Jarrett et al. | |
| 7,709,951 B2 | 5/2010 | Brodsky et al. | |
| 7,875,970 B2 | 1/2011 | Li | |
| 7,944,703 B2 * | 5/2011 | Ni et al. | 361/752 |
| 8,039,975 B2 | 10/2011 | Donis et al. | |
| 2002/0015288 A1 * | 2/2002 | Dibene et al. | 361/711 |
| 2005/0231911 A1 * | 10/2005 | Furuyama et al. | 361/695 |
| 2005/0277280 A1 * | 12/2005 | Brunschwiler et al. | 438/616 |
| 2006/0108097 A1 * | 5/2006 | Hodes et al. | 165/80.4 |
| 2006/0215367 A1 * | 9/2006 | Artman | 361/704 |
| 2006/0227515 A1 * | 10/2006 | Enami et al. | 361/720 |
| 2006/0231944 A1 | 10/2006 | Huang et al. | |
| 2006/0238984 A1 | 10/2006 | Belady et al. | |
| 2007/0041160 A1 * | 2/2007 | Kehret et al. | 361/704 |
| 2007/0295496 A1 | 12/2007 | Hall et al. | |
| 2008/0019095 A1 * | 1/2008 | Liu | 361/704 |
| 2008/0122071 A1 | 5/2008 | Tseng et al. | |
| 2008/0236791 A1 * | 10/2008 | Wayman | 165/80.3 |
| 2008/0296757 A1 | 12/2008 | Hoffman et al. | |
| 2010/0019361 A1 * | 1/2010 | Kummerl et al. | 257/675 |
| 2010/0091463 A1 | 4/2010 | Buresch et al. | |
| 2010/0109137 A1 * | 5/2010 | Sasaki et al. | 257/684 |
| 2010/0224983 A1 | 9/2010 | Huang et al. | |
| 2010/0315787 A1 * | 12/2010 | Li et al. | 361/709 |
| 2011/0031612 A1 * | 2/2011 | Mitsui et al. | 257/713 |
| 2011/0036538 A1 * | 2/2011 | Brunschwiler et al. | 165/11.1 |
| 2011/0067841 A1 * | 3/2011 | Doo et al. | 165/104.19 |
| 2011/0110048 A1 * | 5/2011 | Lima | 361/720 |
| 2012/0139095 A1 * | 6/2012 | Manusharow et al. | 257/690 |
| 2012/0155015 A1 * | 6/2012 | Govindasamy et al. | 361/679.46 |

FOREIGN PATENT DOCUMENTS

| | | |
|---|---|---|
| JP | 10313081 A | 11/1998 |
| JP | 03143888 U | 8/2008 |

OTHER PUBLICATIONS

Wikipedia, "Heat sink", Published on: Aug. 23, 2012, Wikipedia, the free encyclopedia [online], [retrieved on Jan. 17, 2013]. Retrieved from the Internet <URL: http://en.wikipedia.org/w/index.php?title=Heat_sink&oldid=508837133>.

* cited by examiner

INTEGRATED CIRCUIT PACKAGE FOR HEAT DISSIPATION

FIELD OF THE INVENTION

This disclosure relates generally to integrated circuit packages, and in particular, to heat dissipation of integrated circuit packages.

BACKGROUND

Typical electronic components, such as semiconductors, can operate in various high and low power printed circuit boards (PCB). Such operating conditions, allow for the semiconductors to produce various amounts of heat during normal operating conditions. Typically, a high power semiconductor can transfer the heat through an attached heat sink, which then allows for heat to be dissipated into the surrounding environment. A typical low power semiconductor may not even require an attached heat sink since the exposed surface of the low power semiconductor can sufficiently dissipate heat into the surrounding environment. When a semiconductor is being manufactured, the final stage of the semiconductor fabrication is known as integrated circuit (IC) packaging. It is in this final stage of manufacturing that a supporting case is fabricated encasing the semiconductor preventing physical damage and corrosion. The supporting case remains in contact with the surrounding environment thus typically being the main source of heat dissipation for the semiconductor.

The supporting case can be made of various different materials but typically it is of a metallic or plastic material. With ever changing technology and the desire to make such IC packaging smaller, space allotted for the dissipating heat is typically limited.

SUMMARY

One embodiment of the present invention provides an apparatus for enclosing an electronic component to a base comprising, an enclosure attached to a base and surrounding an electronic component. The enclosure divided into a first portion and a second portion along a first plane substantially parallel to the base. The second portion of the enclosure is attached to the base. The first portion of the enclosure is attached to the second portion of the enclosure. The enclosure including one or more extruding elements on an exterior surface of the enclosure. The one or more extruding elements on the exterior surface of the enclosure increases an exterior surface area of the enclosure facilitating dissipation of heat from the electronic component.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

Figure 1:
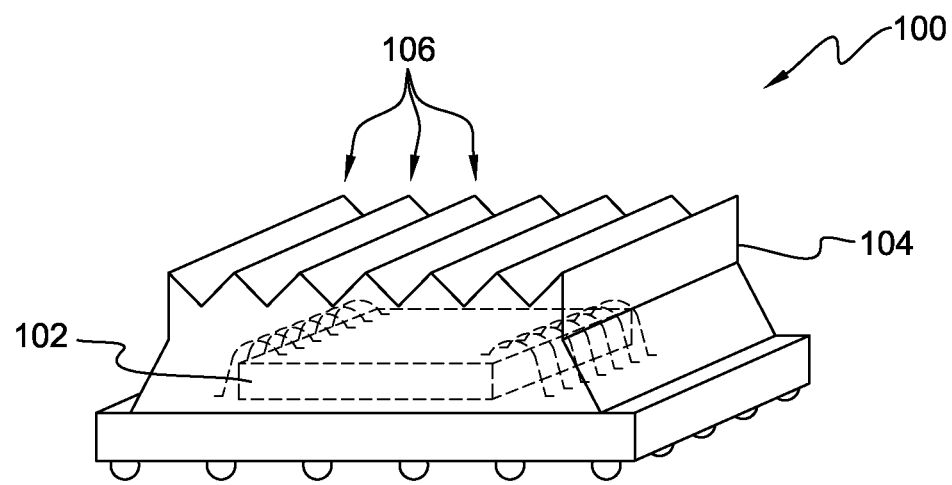
FIG. 1 depicts an isometric front view of an integrated cooling shell on an electronic device in accordance with an embodiment of the present invention.

FIG. 1 depicts an isometric front view of an integrated cooling shell on an electronic device in accordance with an embodiment of the present invention.

In this embodiment, electronic component package 100 contains an electronic component specified as a wire bond packaged semiconductor chip 102. In other embodiments semiconductor chip 102 can be a flip-chip, attached via solder bumps. Semiconductor chip 102 may be a central processing unit (CPU) chip, random access memory (RAM) chip, large-scale integration (LSI) chip, or any electronic component capable of producing heat. Integrated cooling shell 104 is coupled to semiconductor chip 102 to dissipate the heat produced into the surrounding environment. Integrated cooling shell 104 can be integrated into the fabrication process of semiconductor chip 102, more particularly the integrated circuit (IC) packaging phase.

Integrated cooling shell 104 can consist of member elements extruding from a plurality of sides to increase the amount of surface area exposed to the surrounding environment. In this embodiment, integrated cooling shell 104 consists of rows of extruding angular elements 106. Due to integrated cooling shell 104 being coupled to semiconductor chip 102, semiconductor chip 102 can transfer heat to integrated cooling shell 104. Extruding angular elements 106 allow for integrated cooling shell 104 to transfer heat to the surrounding environment in which semiconductor chip 102 resides. In other embodiments, extruding angular elements 106 can take on various other shapes depending on the operating conditions of semiconductor chip 102 and the desired IC packing.

In other embodiments, the alignment and orientation of extruding angular elements 106 can be dependent on the direction of the airflow. If there is airflow movement in the environment in which semiconductor chip 102 resides, extruding angular elements 106 can be aligned accordingly to utilize the cooling capabilities. For example, extruding angular elements 106 can be longitudinally oriented such that extruding angular elements 106 are parallel to the air flow. In another example, not illustrated in FIG. 1, extruding angular elements 106 can have spacing in both the longitudinal and latitudinal direction in situations where the direction of the airflow is less determinable. The number of spaces can depend on the amount of airflow and the amount of heat being dissipated.

Figure 2:
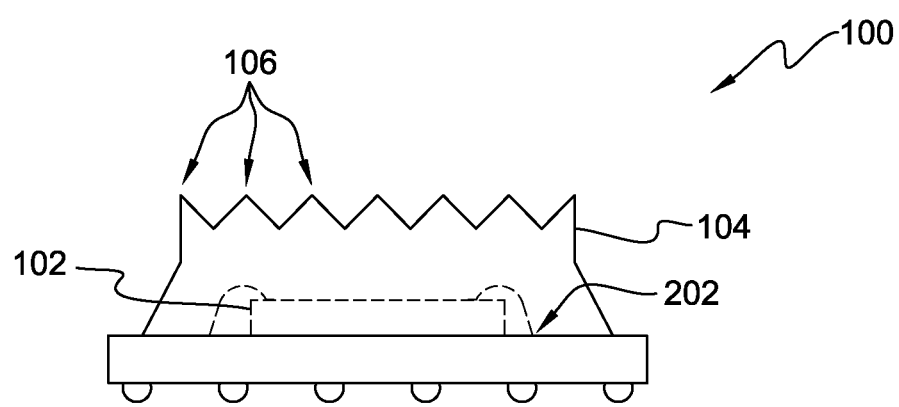
FIG. 2 depicts an enlarged side view of the integrated cooling shell on an electronic device of FIG. 1.

FIG. 2 depicts an enlarged side view of the integrated cooling shell on an electronic device of FIG. 1.

In this exemplary embodiment, extruding angular elements 106 are repetitive angular elements arranged in rows. Integrated cooling shell 104 encases semiconductor chip 102 such that it attached to semiconductor base 202. Semiconductor base 202 is the portion of electronic component package 100 which is coupled to a circuit. The number and size of extruding angular elements 106 on integrated cooling shell 104 depends on the amount of heat that needs to be dissipated from semiconductor chip 102. For example, low power semiconductors typically produce lower heat due to the lower energy being used by the low power semiconductors. Due to the lower heat produced, the size of extruding angular elements 106 can be shorter and/or the number of extruding angular elements 106 can be smaller. In another example, when dealing with semiconductors that produce more heat, the size of extruding angular elements 106 can be larger and/or the number of extruding angular elements 106 can be greater.

Figure 3:
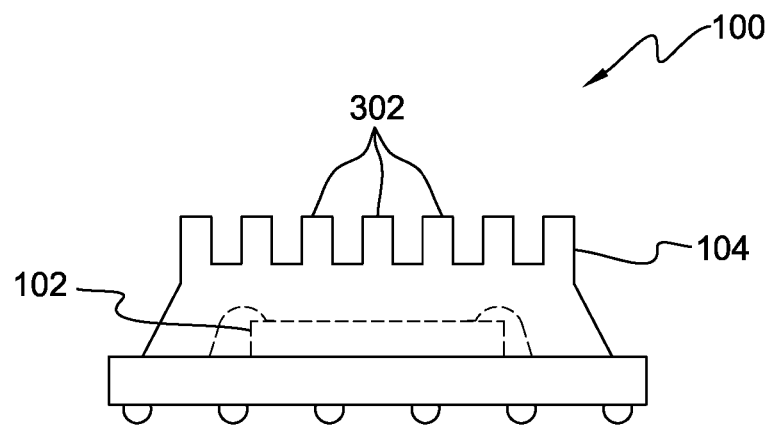
FIG. 3 depicts an enlarged side view of the integrated cooling shell on an electronic device in accordance with another embodiment of the present invention.

FIG. 3 depicts an enlarged side view of the integrated cooling shell on an electronic device in accordance with another embodiment of the present invention.

In this alternative embodiment, integrated cooling shell 104 has finger elements 302 which provide cooling for semiconductor chip 102. As previously mentioned, integrated cooling shell 104 can consist of member elements extruding from a plurality of sides and member elements can take on a variety of shapes. In this example, finger elements 302 are used to provide the required heat dissipation for semiconductor chip 102.

Figure 4:
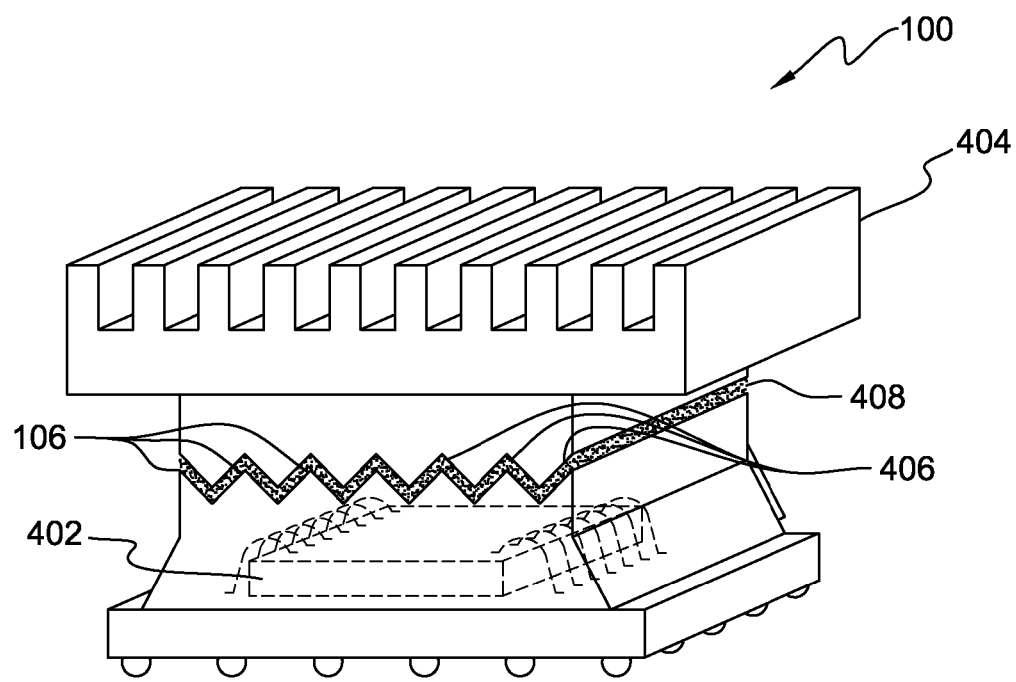
FIG. 4 depicts an isometric front view of an integrated cooling shell on an electronic device in accordance with another embodiment of the present invention

FIG. 4 depicts an isometric front view of an integrated cooling shell on an electronic device in accordance with another embodiment of the present invention.

In this embodiment, semiconductor chip 402 is a high power electronic component that produces a greater amount of heat. Due to the greater amount of heat produced by semiconductor chip 402, extruding angular elements 106, which are used to dissipate heat, may be insufficient. Heat sink 404 with connecting angular heat sink elements 406 can be used to dissipate the additionally produced heat. Thermal adhesive 408 can be used to secure extruding angular elements 106 to angular heat sink elements 406. Typically, thermal adhesive 408 is comprised of synthetic grease capable of transferring heat while securing two surfaces. The increased contact surface area of extruding angular elements 106 and angular heat sink elements 406 to thermal adhesive 408 allows for heat to be transferred to heat sink 404 more efficiently. Transferring heat to heat sink 404 allows for heat sink 404 to dissipate the heat into the surrounding environment.

Figure 5:
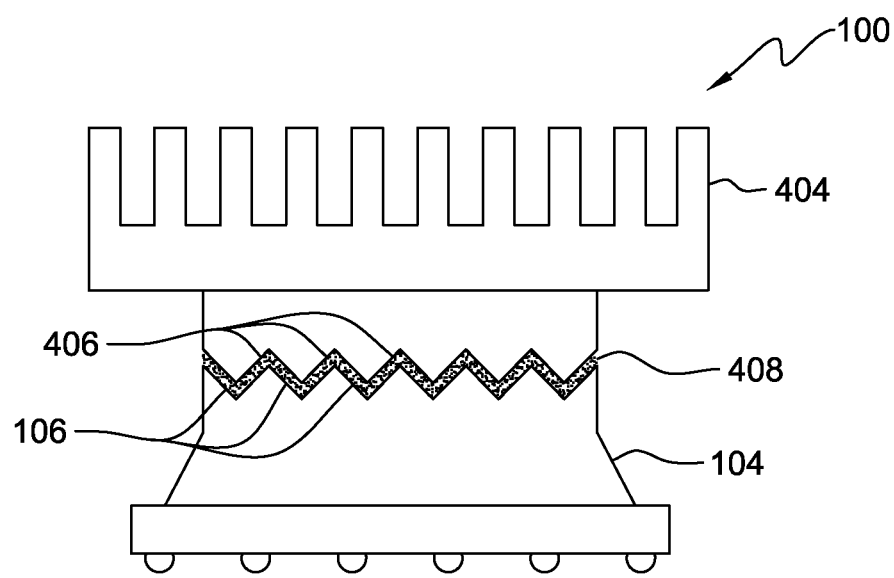
FIG. 5 depicts an enlarged side view of the integrated cooling shell on an electronic device of FIG. 4.

FIG. 5 depicts an enlarged side view of the integrated cooling shell on an electronic device of FIG. 4.

In this exemplary embodiment, the preferred alignment of extruding angular elements 106 and angular heat sink elements 406 are such that a minimal amount of thermal adhesive 408 is used. The pointed edges of extruding angular elements 106 align with the pointed edges of angular heat sink elements 406. In other embodiments, the alignment of extruding angular elements 106 and angular heat sink elements 406 can depend on the preferred orientation of integrated cooling shell 104 with heat sink 404.

Figure 6:
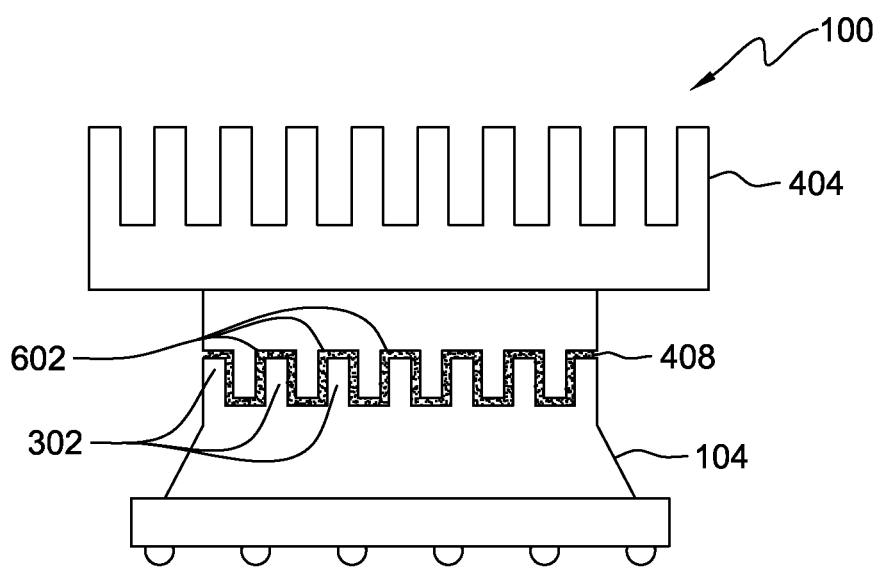
FIG. 6 depicts an enlarged side view of the integrated cooling shell on an electronic device in accordance with another embodiment of the present invention.

FIG. 6 depicts an enlarged side view of the integrated cooling shell on an electronic device in accordance with another embodiment of the present invention.

In this alternative embodiment, integrated cooling shell 104 has finger elements 302 which provide cooling for semiconductor chip 402. Heat sink 404 with connecting finger heat sink elements 602 can be used to dissipate the additionally produced heat with connecting finger elements 302. Thermal adhesive 408 can be used to secure finger elements 302 to finger heat sink elements 602.

Figure 7:
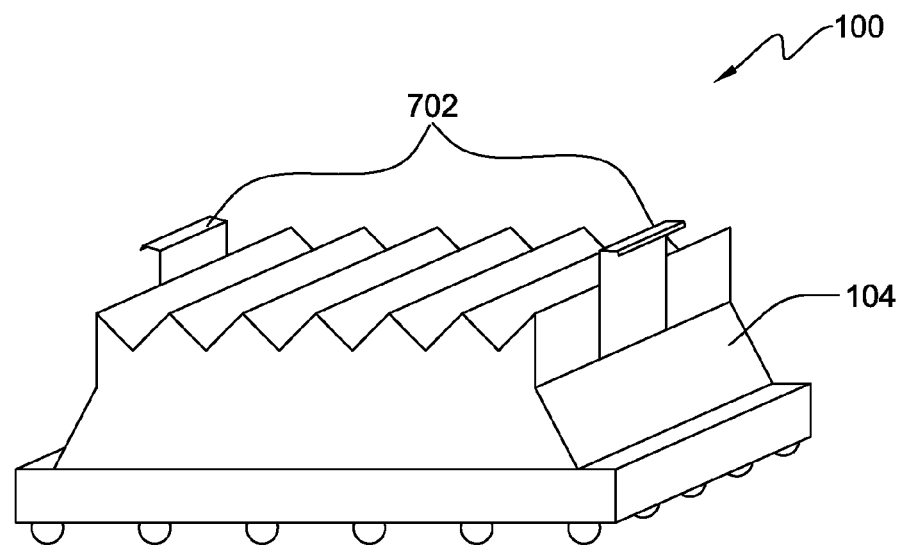
FIG. 7 depicts an isometric front view of an integrated cooling shell with mounting clips on an electronic device in accordance with an embodiment of the present invention.

FIG. 7 depicts an isometric front view of an integrated cooling shell with mounting clips on an electronic device in accordance with an embodiment of the present invention.

In this exemplary embodiment, integrated cooling shell 104 contains two mounting clips 702. Mounting clips 702 can be used on pick and place machines for mounting electronic component package 100 on circuit boards. Typically, the number of mounting clips 702 used can depend on the weight of electronic component package 100. For example, a heavier electronic component package 100 may need additional mounting clips 702 to support the weight when being transferred to a circuit board during the assembly. The shape of mounting clips 702 can be dependent on the pick and place machine since different pick and place machines have different methods of mounting electronic components.

Figure 8:
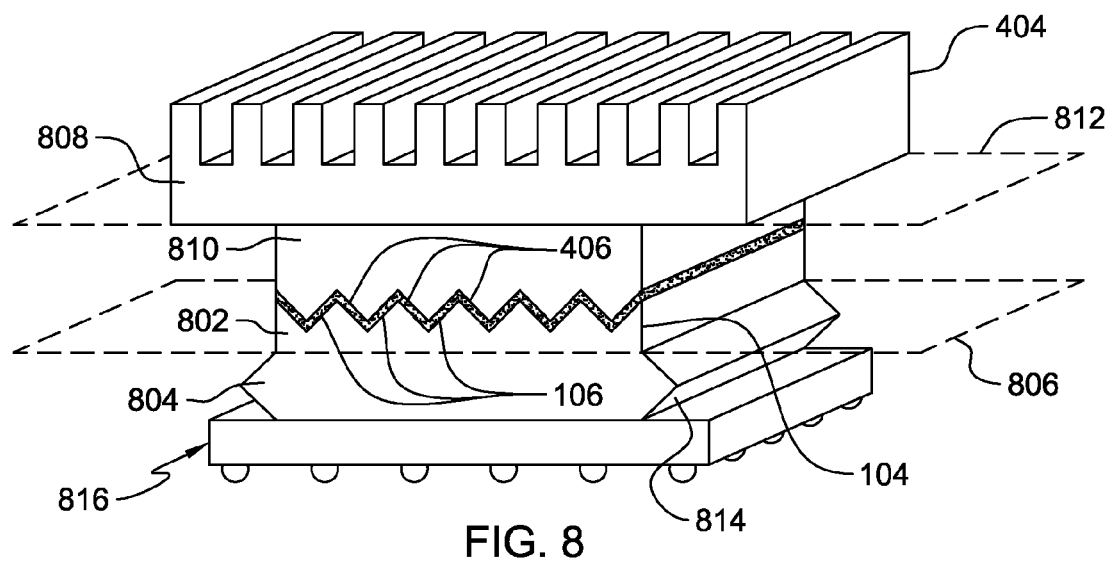
FIG. 8 depicts an isometric front view of an integrated cooling shell with an electronic device in accordance with another embodiment of the present invention.

FIG. 8 depicts an isometric front view of an integrated cooling shell with an electronic device in accordance with another embodiment of the present invention.

In this embodiment, integrated cooling shell 104 is comprised of first portion 802 and second portion 804 separated by first plane 806. First portion 802 contains extruding angular elements 106 and second portion 804 contains extruding elements 814. In this example, extruding elements 814 have a triangular cross-sectional shape similar in shape to both extruding angular elements 106 and angular heat sink elements 406. In other examples, extruding elements 814 can have a rectangular cross-sectional shape. Second portion 804 of integrated cooling shell 104 is connected to base 816 of integrated cooling shell 104. Heat sink 404 is comprised of first portion 808 and second portion 810 separated by second plane 812. Second portion 810 contains angular heat sink elements 406 wherein thermal adhesive 408 is used to attach angular heat sink elements 406 of second portion 810 to extruding angular elements 106 of first portion 802. Extruding angular elements 106 and angular heat sink elements 406 are aligned substantially parallel to one and other when heat sink 404 is mounted to integrated cooling shell 104.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a heat sink for an Integrated Circuit (IC) package (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for enclosing an electronic component to a base, comprising:
   an enclosure attached to a base and surrounding an electronic component;
   the enclosure divided into a first portion and a second portion along a first plane substantially parallel to the base such that the first portion of the enclosure includes an exterior top surface of the enclosure, and the second portion includes a plurality of exterior side surfaces of the enclosure;

wherein the second portion of the enclosure is attached to the base;

wherein the first portion of the enclosure is attached to the second portion of the enclosure;

the enclosure including one or more extruding elements having a triangular cross-sectional shape along a length of each of at least two of the exterior side surfaces of the second portion of the enclosure; and wherein the one or more extruding elements on the exterior side surfaces of the second portion of the enclosure increases an exterior surface area of the enclosure facilitating dissipation of heat from the electronic component.

2. The apparatus of claim 1, wherein the exterior top surface of the first portion includes at least two extruding elements, wherein the at least two extruding elements are uniform in height.

3. The apparatus of claim 2 wherein the at least two extruding elements are symmetrically aligned with one and other.

4. The apparatus of claim 2, wherein each of the at least two extruding elements have a triangular cross-sectional shape along the length thereof.

5. The apparatus of claim 2, wherein each of the at least two extruding elements have a rectangular cross-sectional shape along the length thereof.

6. The apparatus of claim 1, wherein each of the at least two of the exterior side surfaces of the second portion of the enclosure includes at least two extruding elements, wherein the at least two extruding elements are uniform in height.

7. The apparatus of claim 6, wherein the at least two extruding elements are symmetrically aligned with one and other.

8. The apparatus of claim 6, wherein each of the at least two extruding elements have a triangular cross-sectional shape along the length thereof.

9. The apparatus of claim 1, further comprising:
a heat sink divided into a first portion and a second portion along a second plane, wherein the second plane is substantially parallel to the base; and
wherein the second portion of the heat sink is attached to the first portion of the enclosure.

10. The apparatus of claim 9, wherein the second portion of the heat sink is attached to the exterior top surface of the first portion of the enclosure.

11. The apparatus of claim 10, wherein a surface of the second portion of the heat sink attached to the exterior top surface of the first portion of the enclosure includes one or more elements.

12. The apparatus of claim 11, wherein the one or more elements of the heat sink have a triangular cross-sectional shape along the length thereof.

13. The apparatus of claim 11, wherein the one or more elements of the heat sink have a rectangular cross-sectional shape along the length thereof.

14. The apparatus of claim 11, wherein a thermal adhesive detachably attaches the one or more elements of the heat sink to the exterior top surface of the first portion of the enclosure.

15. The apparatus of claim 11, wherein at least two elements of the heat sink are symmetrical to one and other.

16. The apparatus of claim 11, wherein the one or more elements of the heat sink are substantially aligned in parallel with one or more extruding elements of the exterior top surface of the first portion of the enclosure.

17. The apparatus of claim 4, further comprising:
a heat sink divided into a first portion and a second portion along a second plane, wherein the second plane is substantially parallel to the base;
wherein the second portion of the heat sink is attached to the exterior top surface of the first portion of the enclosure;
wherein a surface of the second portion of the heat sink attached to the exterior top surface of the first portion of the enclosure includes one or more elements; and
wherein the one or more elements of the heat sink have a triangular cross-sectional shape along the length thereof.

18. The apparatus of claim 10, wherein the exterior top surface of the first portion of the enclosure includes rows of extruding angular elements.

19. The apparatus of claim 18, wherein a surface of the second portion of the heat sink includes rows of extruding angular elements coupled with the rows of extruding angular elements of the exterior top surface of the first portion of the enclosure.

* * * * *